(12) United States Patent
Hage

(10) Patent No.: US 7,265,817 B2
(45) Date of Patent: Sep. 4, 2007

(54) LITHOGRAPHIC APPARATUS, DEVICE MANUFACTURING METHOD, AND SLIDE ASSEMBLY

(75) Inventor: Edward Hage, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 440 days.

(21) Appl. No.: 10/926,396

(22) Filed: Aug. 26, 2004

(65) Prior Publication Data
US 2005/0083508 A1    Apr. 21, 2005

(30) Foreign Application Priority Data
Aug. 27, 2003   (EP) .................................. 03077687

(51) Int. Cl.
G03B 27/32    (2006.01)
G03B 27/58    (2006.01)

(52) U.S. Cl. .......................................... 355/72; 355/77
(58) Field of Classification Search ................. 355/53, 355/72, 73, 75, 76, 77
See application file for complete search history.

(56) References Cited
U.S. PATENT DOCUMENTS

| | | |
|---|---|---|
| 5,229,872 A | 7/1993 | Mumola |
| 5,296,891 A | 3/1994 | Vogt et al. |
| 5,327,060 A | 7/1994 | Van Engelen et al. |
| 5,523,193 A | 6/1996 | Nelson |
| 5,969,441 A | 10/1999 | Loopstra et al. |
| 6,046,792 A | 4/2000 | Van Der Werf et al. |
| 6,339,266 B1 | 1/2002 | Tanaka |

FOREIGN PATENT DOCUMENTS

| | | |
|---|---|---|
| JP | 2002-333018 | 11/2002 |
| WO | WO98/33096 | 7/1998 |
| WO | WO98/38597 | 9/1998 |
| WO | WO98/40791 | 9/1998 |

*Primary Examiner*—Rodney Fuller
(74) *Attorney, Agent, or Firm*—Pillsbury Winthrop Shaw Pittman LLP (57) ABSTRACT

A lithographic apparatus includes a slide assembly, having a base, which base has a running surface, a slide member adapted to move over the running surface, and a bearing system configured to create a distance between the slide member and the running surface. The bearing system includes a first force generating device configured to provide a first force in a first direction, the first direction being substantially perpendicular to the running surface, and a second force generating device configured to provide a second force in a second direction, the second force being opposite to the first direction. The first and second force generating devices are adapted to cooperate in establishing the distance between the slide member and the running surface. The second force generating device includes a plurality of force generating elements defining an area between them, in which area the first force generating device is arranged.

22 Claims, 5 Drawing Sheets

LITHOGRAPHIC APPARATUS, DEVICE MANUFACTURING METHOD, AND SLIDE ASSEMBLY

PRIORITY INFORMATION

This application claims priority from European Patent Application No. 03077687.6, filed Aug. 27, 2003, the contents of which is herein incorporated by reference in its entirety

BACKGROUND

1. Field of the Invention

The present invention relates to lithographic apparatus and methods

2. Description of the Related Art

The term "patterning structure" as here employed should be broadly interpreted as referring to a structure that can be used to endow an incoming radiation beam with a patterned cross-section, corresponding to a pattern that is to be created in a target portion of the substrate. Generally, the pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such a device is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation devices. Once again, the mirrors are matrix-addressable, such that addressed mirrors and unaddressed mirrors will reflect an incoming radiation beam in different directions; in this manner, the reflected beam is patterned according to the addressing pattern of the matrix-addressable mirrors. The matrix-addressing can, for example, be performed using suitable electronic devices. In both of the situations described hereabove, the patterning structure can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable liquid-crystal display (LCD) panel. An example of such a device is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by scanning the mask pattern under the beam of radiation in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a device manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example, whereby any of these types of projection system may either be suitable for conventional imaging or be suitable for imaging in the presence of an immersion fluid. The radiation system may also include components operating according to any of these design types for directing, shaping, or controlling the projection beam of radiation, and such components may also be referred to below, collectively or singularly, as a "lens". Further, the lithographic apparatus may be of a type having two or more substrate tables (and/or two or more mask tables). In such "multiple stage" machines the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

At several locations in conventional lithographic apparatus, moveable slide members are used for carrying objects. Such objects can be machine parts mounted on the slide member, but also objects that are exchanged with other objects of the same type regularly, such as a patterning structure or a substrate such as a silicon wafer. Some of the slide members are adapted to move over a running surface of a base. The running surface of the base can be a flat plane, but it can also have a different shape. A bearing system is provided to allow movements of the slide member over the running surface.

It is desirable that the slide member carries out its movements without friction between the slide member and the running surface. In order to achieve that, bearing system can be used to create a distance between the slide member and the running surface (the so-called "gap") during the movements of the slide member, so that contact between the slide member and the running surface is avoided. The distance is created by the bearing system by applying a repelling force between the slide member and the running surface of the base. When the slide member is located above the running surface, creating the distance between the slide member and the running surface requires lifting the slide member relative to the running surface with a lifting force.

Generally, the bearing system may include magnets or air bearings in order to create a distance between the slide member and the running surface. In order for both the magnet and air systems to function properly and reliably, it is desirable to closely control the distance between the side of the bearing system facing the running surface and the running surface itself (that is: the width of the gap). Therefore, it is desirable that the face of the bearing system that faces the running surface, and also the free surface of the slide member directly adjacent to it, be even.

When an air bearing is used, a gas film is created and maintained between the slide member and the running surface during operation of the bearing system. The stiffness of this gas film during operation is a relevant parameter in the dynamic behavior of the slide member, especially with regard to the vibrations of the slide member, which vibrations may give rise to unallowable inaccuracies in positioning of objects carried by the slide member.

Depending on the design of the face of the air bearing that creates and maintains the gas film, an optimal or sufficient stiffness of the gas film may be achieved at a certain width of the gap, in combination with a corresponding nominal load on the slide member.

In order to produce this particular gap width, attraction devices may be provided in the bearing system. These attraction devices are adapted to provide an attracting force between the slide member and the running surface to balance the repelling force generated by the air bearings or magnets, which repelling force creates a distance between the slide member and the running surface. Therefore, known bearing systems do not only include repelling devices, that are adapted to provide a repelling force between the slide member and the running surface, but also attraction devices.

Conventional bearing systems configured to allow a slide member to move over a running surface without friction are generally heavy and large. As conventional bearing systems are mounted at least partly in the slide member, they generally cause the slide members to be heavy and large too. This may be disadvantageous, since new developments ask for faster moving slide members with higher acceleration levels, while the maximum allowable motor current in the motor that drives the slide member is limited.

SUMMARY

Embodiments of the invention include a lithographic apparatus which is provided with moveable slide members configured to carry one or more objects, which moveable slide members are configured to move over a running surface of a base without friction, which moveable slide members can reach higher acceleration levels and/or higher speeds while moving over the running surface than known slide members.

According to an embodiment of the invention, a lithographic apparatus, includes: an illumination system configured to provide a beam of radiation; a support structure configured to support a patterning device, the patterning device serving to impart the beam of radiation with a pattern in its cross section; a substrate table configured to carry a substrate; a projection system configured to project the patterned beam onto a target portion of the substrate; and a a slide assembly, including a base, which has a running surface, a slide member, which is adapted to move over the running surface, a bearing system configured to create a distance between the slide member and the running surface, the bearing system including a first force generating device configured to provide a first force which first force has a component in a first direction, which first direction is at least substantially perpendicular to the running surface, and a second force generating device configured to provide a second force, which second force has a component in a second direction, which second direction is opposite to the first direction, the first force generating device and second force generating device being adapted to co-operate in establishing the distance between the slide member and the running surface, wherein the second force generating device includes a plurality of force generating elements, the force generating elements together defining an area between them, in which area the first force generating device is arranged.

For purposes of clarity, the force generating devices that provide a repelling force are referred to as "repelling devices", and the force generating devices that provide an attraction force between the slide member and the surface are referred to as "attraction devices".

In the following description, the first force generating devices are attraction devices, and the second force generating devices are repelling devices. However, it should be kept in mind that the direction of the forces can also be the other way around, that is: the first force generating devices then are repelling devices, and the second force generating devices then are attraction devices.

The resultant force of the first force generating device will be referred to as the "first force", and the resultant force of the second force generating device will be referred to as the "second force".

In a conventional bearing system, the second force generating device is arranged alongside with and parallel to the first force generating device. The first force generating device is located on one side of the slide member, the second force generating device on the other side.

The slide assembly in accordance with an embodiment of the invention includes a bearing system in which the second force generating device includes a plurality of force generating elements. All these force generating elements define an area between them, in which area the first force generating device is arranged.

By arranging the first force generating device and the second force generating device of the bearing system in accordance with an embodiment of the invention, the design of the bearing system in accordance with an embodiment of the invention may be more compact than conventional designs. Therefore, the slide member according to an embodiment of the invention is smaller, and has less weight than known conventional slide members. Due to the reduction of the weight of the slide member, the slide member can achieve a higher level of acceleration and a higher speed compared to known slide members, without an increase of the current of the motor driving the slide member.

Also, in conventional slide members, due to the distance between the first and the second force generating devices, a bending moment is introduced. As the distance between the running surface and the slide member has to be controlled very close, it is desirable to avoid deflection of the slide member under the influence of this moment, since bending the slide member can introduce local deviations of the optimal distance between the surface and the slide member. Therefore, conventional slide members are designed to be very stiff, which also leads to heavy and large slide members.

In the bearing system of the slide assembly in accordance with an embodiment of the invention, the point of action of the first force and the point of action of the second force are located closer to each other than in conventional bearing systems, which results in a reduction of the resultant bending moment induced onto the slide member by the bearing system. This may lead to an additional reduction of the weight of the slide member.

The first and the second force generating devices can even be arranged in such a way that the point of action of the first force and the point of action of the second force coincide. This way, there is even no resultant bending moment from the first and second force, so the positive effect of the bearing system according to an embodiment of the invention increases. This can be achieved by arranging the second force generating device in such a way that they encompass the first force generating device completely, and that they follow the outside contour of the first force generating device at a constant distance over the entire circumference.

Arranging the first force generating device and the second force generating device of the bearing system in accordance with an embodiment of the invention can reduce the manufacturing tolerances of the slide member as compared to conventional slide members. Since the first force generating device and the second force generating device of the bearing system in accordance with an embodiment of the invention are located on a single face of the slide member, it is no longer required to arrange two faces of the slide member accurately relative to each other. This reduces the manufacturing costs of the slide member.

In an embodiment of the invention, the first force generating device includes an array of magnetic bodies interacting with a metal counter plate and the second force generating device includes an air bearing. The air bearing includes an array of holes. The array of holes is arranged to encompass the array of magnetic bodies. In an embodiment of the invention, the holes and the magnetic bodies are arranged in the slide member and the metal counter plate may be arranged in or at the running surface. Each of the holes of the air bearing is considered a force generating element in the sense of claim 1.

In an embodiment of the invention, the metal counter plate in the surface closes the magnetic flux lines of the magnetic bodies in the slide member, so the magnetic bodies attract the metal counter plate. On the side of the magnetic bodies facing away from the running surface, the magnetic flux lines are also closed. This can be achieved by providing a metal back plate which is arranged in the slide member, adjoining the magnetic bodies on their side facing away from the surface. The back plate may adjoin the magnetic bodies directly, or may be located at a distance from the magnetic bodies.

In an embodiment of the invention, the magnetic bodies and the metal back plate are mould in a ceramic casing, which also includes the array of holes of the air bearing. In an embodiment of the invention, the entire face of the slide member facing the running surface is made of ceramic material.

According to yet another embodiment of the invention, ceramic material can be finished very even, which facilitates the control of the distance between the slide member and the running surface. In an embodiment, as a metal counter plate is provided on the surface, the materials of the running surface and the face of the slide member interacting with the running surface are very different. This results in very low adhesion between the slide member and the running surface if they come into sliding contact with each other, for example in case of a bearing system failure or unintended movement of the slide member when the bearing system is switched off. This low adhesion prevents (parts and/or particles of) the slide member and/or the bearing system from getting stuck to the running surface and the other way around due to cold welding.

As an alternative, the magnetic bodies may be arranged in a metal casing, made of steel, in an embodiment of the invention. This way, no back plate is necessary since the magnetic flux lines are closed by the metal casing. In an embodiment of the invention, the magnetic bodies are cast in a pouring mass that can be finished to an even surface, such as an epoxy resin.

As an alternative to using magnetic forces to create attraction between the slide member and the surface, an at least partial vacuum is used in an embodiment of the invention.

As an alternative to using an air bearing to create lift of the slide member from the surface, repelling magnetic forces are used in an embodiment of the invention.

The slide member of the bearing system according to the invention is used, and may be driven by a linear motor.

The use of a slide member according to an embodiment of the invention is not limited with respect to the direction of the running surface, as long as gravity forces are taken into account in the balance of forces. The first and second force generating devices are to be dimensioned, based on the balance of forces. However, it may be desirable that the slide member, with a bearing system according to an embodiment of the invention, for moving over a surface in a non-horizontal direction, use an additional force generating device to compensate for gravity.

It will be appreciated that slide members assemblies with a bearing system according to an embodiment of the invention can be used anywhere in a lithographic apparatus where frictionless movement over a surface, either one-dimensional or two-dimensional, is desired. It should be understood that the use of slide member assemblies according to an embodiment of the invention is even not limited to lithographic apparatus.

It will be appreciated that slide member assemblies according to an embodiment of the invention can be used to lift objects relative to a surface of a base, without the objects being moved parallel to that surface.

According toga further embodiment of the invention there is provided a device manufacturing method including: providing a substrate that is at least partially covered by a layer of radiation-sensitive material; providing a beam of radiation; providing the beam with a pattern in its cross-section; projecting the patterned beam of radiation onto a target portion of the layer of radiation-sensitive material; creating a distance between the running surface of a base and a slide member which carries and object, to allow movement of the slide member over the running surface using a bearing system, the bearing system including a first force generating device configured to provide a first force which first force has a component in a first direction, which first direction is at least substantially perpendicular to the running surface, and a second force generating device configured to provide a second force, which second force has a component in a second direction, which second direction is opposite to the first direction, the first force generating device and the second force generating device being adapted to co-operate in establishing the distance between the slide member and the running surface, wherein the second force generating device includes a plurality of force generating elements, all force generating elements together defining an area between them, in which area the first force generating device is arranged.

A bearing system configured to support a slide member over a running surface of a base, according to an embodiment of the invention, includes: a first force generating device configured to provide a first force in a first direction, the first direction being substantially perpendicular to the running surface; and a second force generating device configured to provide a second force in a second direction, the second direction being opposite to the first direction, wherein the first and second force generating devices are arranged in the slide member such that an action line of the first force substantially coincides with an action line of the second force.

A device manufacturing method, according to another embodiment of the invention, includes patterning a beam of radiation with a pattern in its cross-section; projecting the patterned beam of radiation onto a target portion of a substrate; and supporting a slide member over a running surface of a base, the supporting including: applying a first force onto the running surface, said the force being substantially perpendicular to the running surface; applying a second force onto the slide member, the second force being opposite to the first force, wherein the first force and the second force act-to space apart the slide member from the running surface and are directed such that a bending moment induced by each of the first and second force on the slide member is substantially zero.

In another embodiment of the invention, there is provided a device manufacturing method including patterning a beam of radiation with a pattern in its cross-section; projecting the patterned beam of radiation onto a target portion of a substrate; and supporting a slide member over a running surface of a base, the supporting including: applying a first force onto the running surface, the first force being substantially perpendicular to the running surface; applying a second force onto the slide member, the second force being opposite to the first force, wherein a line of action of the first force substantially coincides with a line of action of the second force such that the first and second force act to space apart the slide member from the running surface.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle", "wafer", or "die" in this text should be considered as being replaced by the more general terms "mask", "substrate", or "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as for example ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
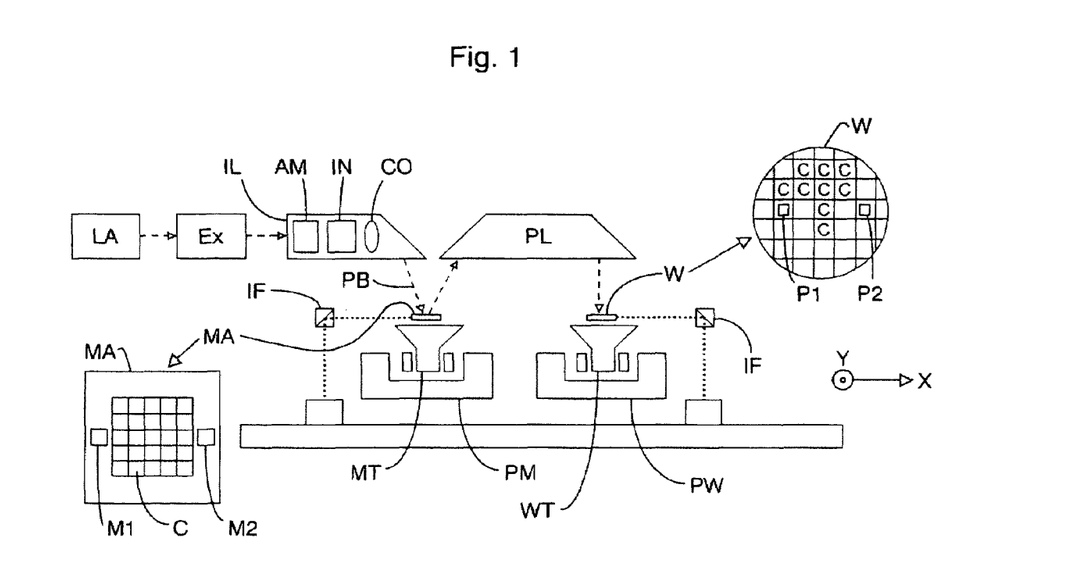
FIG. 1 depicts a lithographic apparatus according to an embodiment of the invention.

FIG. 1 schematically depicts a lithographic apparatus according to an embodiment of the invention. The apparatus includes a radiation system Ex, IL, configured to supply a beam PB of radiation (e.g. laser radiation). In this particular case, the radiation system also includes a radiation source LA. The apparatus also includes a first object table (mask table) MT provided with a mask holder configured to hold a mask MA (e.g. a reticle), and connected to a first positioning device PM configured to accurately position the mask with respect to the projection system ("lens"), item PL. The apparatus further includes a second object table (substrate table) WT provided with a substrate holder configured to hold a substrate W (e.g. a resist-coated silicon wafer), and connected to a second positioning deviceW configured to accurately position the substrate with respect to the projection system ("lens"), item PL, the projection system ("lens") PL being configured to image an irradiated portion of the mask MA onto a target portion C (e.g. including one or more dies) of the substrate W.

As here depicted, the apparatus is of a reflective type (i.e. has a reflective mask). However, in general, it may also be of a transmissive type, for example, with a transmissive mask. Alternatively, the apparatus may employ another kind of patterning device, such as for example a programmable mirror array of a type as referred to above. The source LA (e.g. a laser source) produces a beam of radiation. This beam is fed into an illumination system (illuminator) IL, either directly or after having traversed a conditioning device, such as for example a beam expander Ex. The illuminator IL may include an adjusting device AM configured to adjust the angular intensity distribution in the beam. Generally, at least the outer and/or inner radial extent (commonly referred to as c-outer and i-inner, respectively) of the intensity distribution in a pupil plane of the radiation system can be adjusted. In addition, the illuminator IL will generally include various other components, such as an integrator IN and a condenser CO. In this way, the beam PB impinging on the mask MA has a desired uniformity and intensity distribution in its cross-section. It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently impinges on the mask MA, which is held on a mask table MT. Reflected from the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is moved in a given direction (the so-called "scan direction", e.g. the y direction) with a speed v, so that the beam of radiation PB is caused to scan over the mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
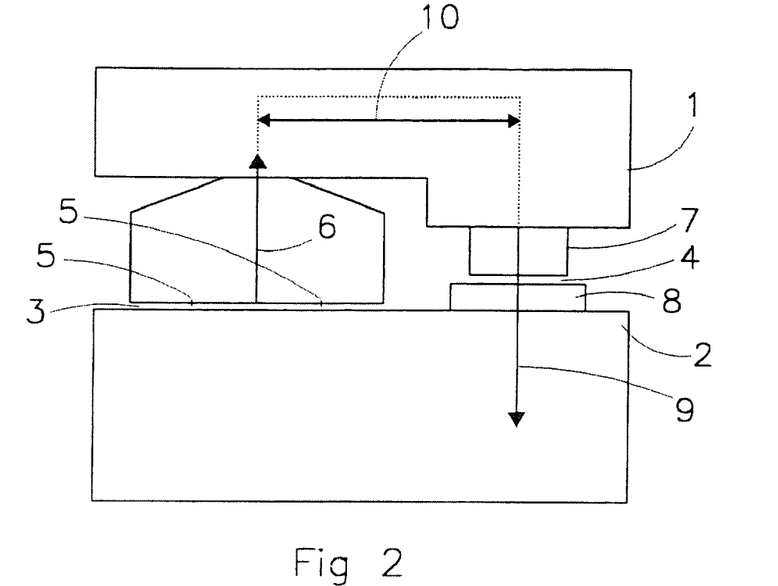
FIG. 2 shows an elevational view of a conventional slide assembly.
Figure 3:
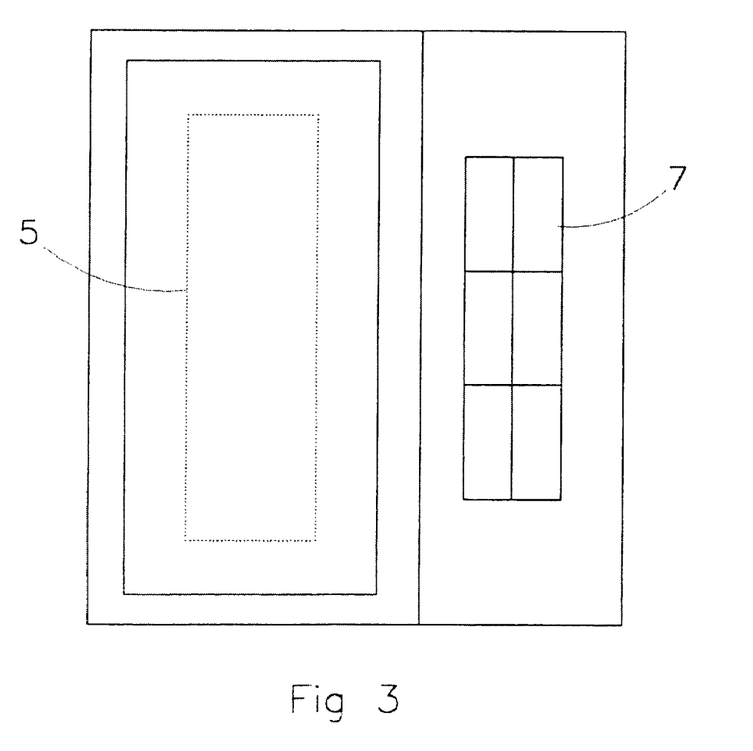
FIG. 3 shows a bottom view of a slide member in accordance with FIG. 2.

FIG. 2 shows a top view of a slide assembly having a conventional bearing system and FIG. 3 shows a bottom view of a slide member of such a slide assembly.

Slide member 1 is moveable over running surface 2. In order to be able to move without friction, gaps 3 and 4 are created, using force generating devices. The slide member 1 includes two types of force generating devices: an air bearing 5, to create a repelling force 6, and an array of magnets 7, interacting with a metal counter plate 8 to create an attraction force 9. The forces 6,9 indicated in FIG. 2 are the resultant forces of the air bearing 5 and the array of magnets 7, respectively.

The forces 6,9 have respective points of action at a distance 10 from each other. This causes a bending moment on the slide member.

FIG. 3 shows the relative position of the air bearing 5 and the array of magnets 7 in a slide member of a conventional bearing system.

Figure 4:
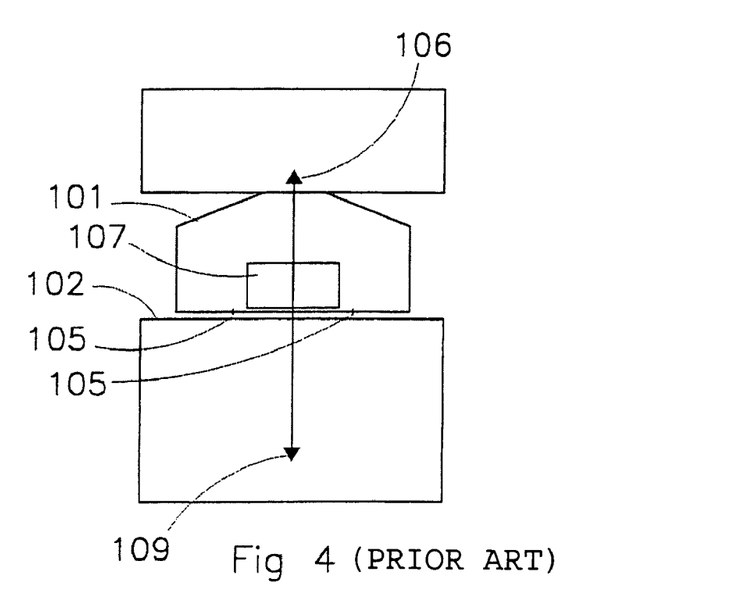
FIG. 4 shows an elevational view of a slide assembly in accordance with an embodiment of the invention.
Figure 5:
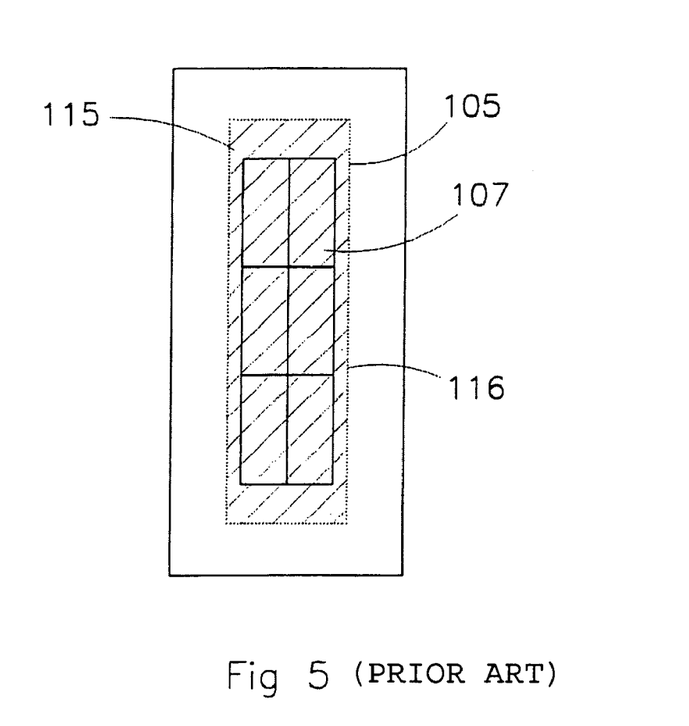
FIG. 5 shows a bottom view of a slide member in accordance with FIG. 4.

FIG. 4 shows a top view of a slide assembly including a bearing system in accordance with an embodiment of the invention, and FIG. 5 shows a bottom view of a slide member of such a slide assembly. The slide member 101 is moveable over running surface 102.

The slide member 101 includes a second force generating device which includes a plurality of force generating elements. All of these force generating elements define an area between them, in which area the first force generating device is arranged.

In the embodiment of FIGS. 4 and 5, the second force generating device includes an air bearing 105. The air bearing 105 includes an array of holes 116, each hole 116 being a force generating element, as pressurized gas such as air flows out of each hole 116 in order to create a repelling force on the slide member 101.

The holes 116 define an area 115 between them. In this area 115, the array of magnets 107 is arranged.

Comparing FIG. 4 to FIG. 2 shows that the slide member 101 according to the invention can be dimensioned to be smaller than the conventional slide member 1.

As can be seen in FIG. 4, the points of action of the repelling force 106 and the attraction force 109 coincide.

Therefore, there is no resultant bending moment due to these forces 106, 109 acting on the slide member 101.

Figure 6:
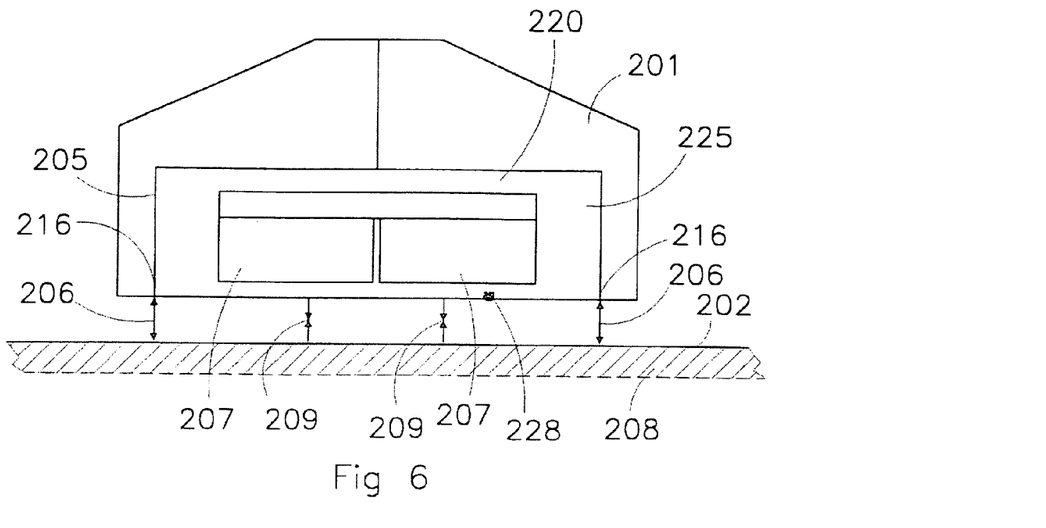
FIG. 6 shows a slide assembly in accordance with an embodiment of the invention.

FIG. 6 shows a slide assembly with a bearing system according to an embodiment of the invention.

Slide member 201 is adapted to be moved over running surface 202. In this embodiment, a repelling force 206 is provided by an air bearing 205, which includes an array of holes 216, out of which pressurized gas, such as air, flows. An attraction force 209 is generated by an array of magnets 207. Running surface 202 includes a metal counter plate 208 configured to close the magnetic flux lines 221 generated by an array of magnets 207 on the side of the running surface 202.

On the side of the magnets 207 facing away from the running surface 202, the magnetic flux lines 221 also have to be closed. This can be achieved by providing a metal back plate 220 which is arranged in the slide member 201, adjoining the magnets 207 on their side facing away from the surface 202. In an embodiment of the invention, the magnets 207 and the metal back plate 220 are mould in a ceramic casing 225, which also includes an array of holes 216 of an air bearing 205. In an embodiment of the invention, entire face 228 of the slide member 201 that interacts with the running surface 202 over which the slide member 201 is adapted to move is of ceramic material.

Figure 7:
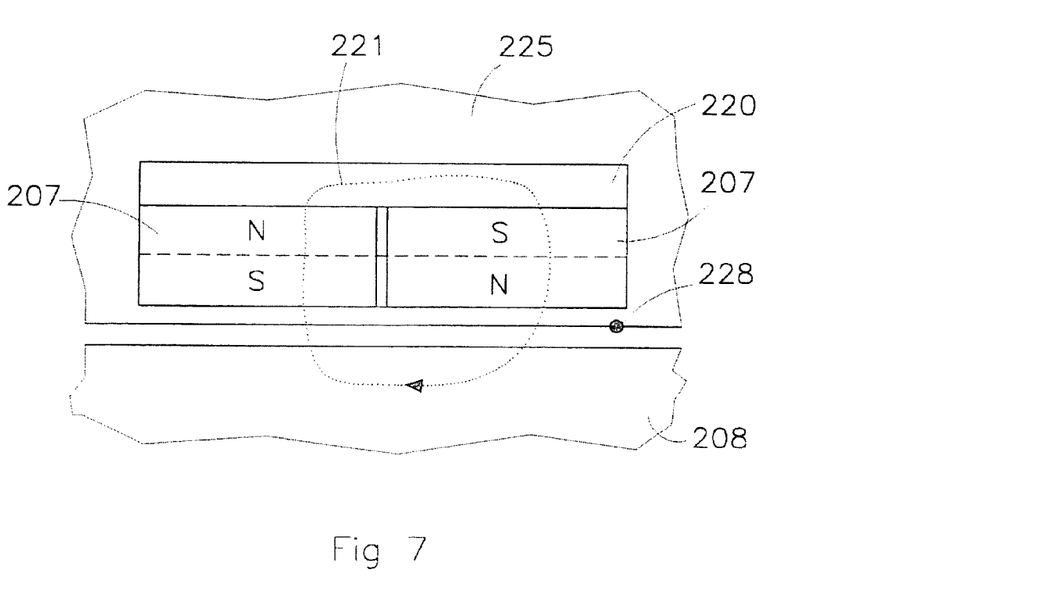
FIG. 7 shows the closing of the magnetic flux lines in the embodiment of FIG. 6.

FIG. 7 shows the closing of the magnetic flux lines 221 in the embodiment of FIG. 6.

Figure 8:
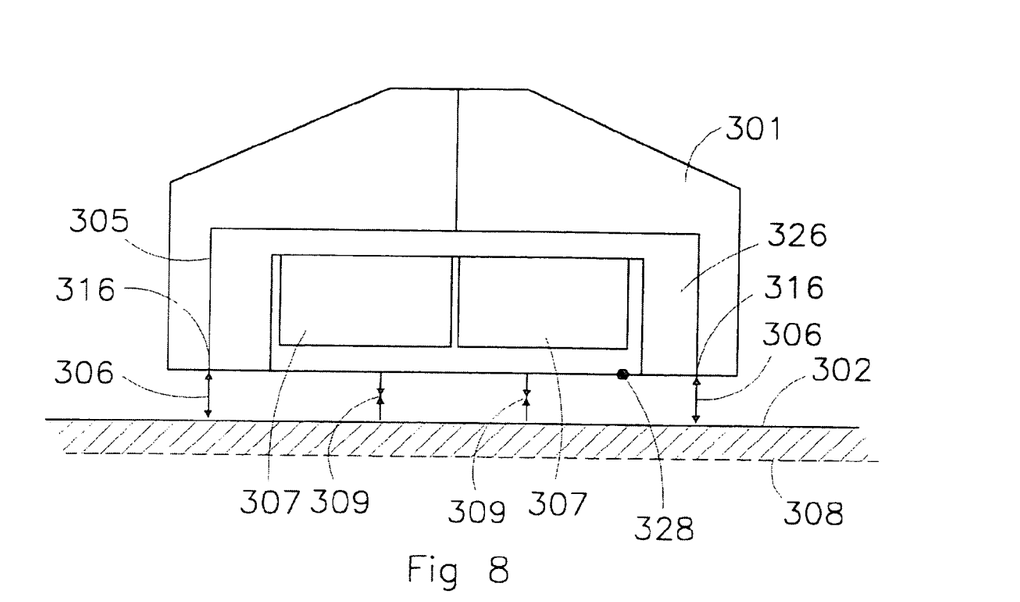
FIG. 8 shows a slide assembly in accordance with an embodiment of the invention.

FIG. 8 shows a slide assembly with a bearing system according to an embodiment of the invention.

Slide member 301 is configured to be moved over running surface 302. In this embodiment, a repelling force 306 is provided by an air bearing 305, which includes an array of holes 316, out of which pressurized gas, such as air, flows. An attraction force 309 is generated by an array of magnets 307. Running surface 302 includes a metal counter plate 308 configured to close the magnetic flux lines 331 generated by an array of magnets 307 on the side of the running surface 302.

On the side of the magnets 307 facing away from the running surface 303, the magnetic flux lines 321 also have to be closed. This can be achieved by providing a metal casing 325, which is made of steel in an embodiment of the invention. This way, no back plate is necessary since the magnetic flux lines 321 are closed by the metal casing 325. In an embodiment of the invention, the magnets 307 are in this embodiment cast in a pouring mass 326 that can be finished to an even surface, such as an epoxy resin, in order to create an even face 328.

Figure 9:
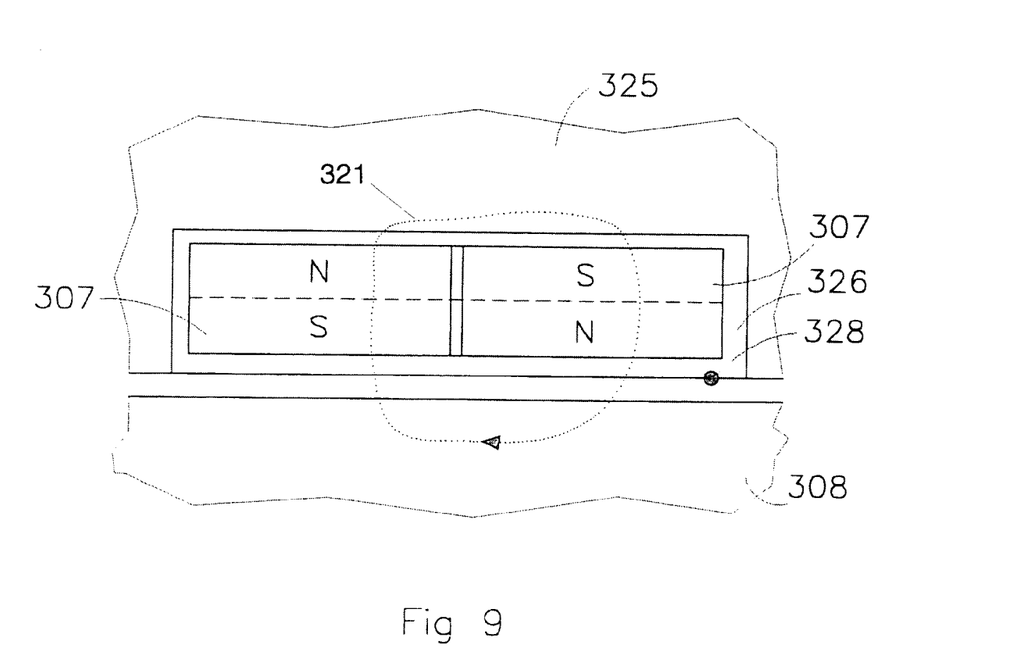
FIG. 9 shows the closing of the magnetic flux lines in the embodiment of FIG. 8.

FIG. 9 shows the closing of the magnetic flux lines 321 in the embodiment of FIG. 8.

While specific embodiments of the invention have been described above, it will be appreciated that the invention may be practiced otherwise than as described. The description is not intended to limit the invention.

What is claimed is:

1. A slide assembly comprising:
   a base including a running surface,
   a slide member configured to move over the running surface, and
   a bearing system configured to create a distance between the slide member and the running surface, the bearing system comprising:
   (a) a magnetically active system configured to provide a magnetic attraction force in a first direction, said first direction being at least substantially perpendicular to the running surface, and
   (b) an air bearing system configured to provide a repelling force in a second direction, said second direction being opposite to the first direction, the magnetically active system and the air bearing system being adapted to cooperate in establishing the distance between the slide member and the running surface,
   wherein the air bearing system comprises a plurality of air bearing elements, said plurality of air bearing elements arranged to substantially enclose an area devoid of air bearing elements in which substantially the entire magnetically active system is arranged.

2. The slide assembly of claim 1, wherein the air bearing system encompasses the magnetically active system.

3. The slide assembly of claim 1, further comprising a suction system configured to create at least partial vacuum to create an attraction force.

4. The slide assembly of claim 1, wherein the
   air bearing elements includes an array of holes to let out pressurized gas, said air bearing elements being configured to provide a repelling force between the slide member and the surface over which the slide member is configured to move, and
   wherein the magnetically active system includes an array of magnetic bodies,
   wherein the running surface comprises a metal counter plate configured to close the magnetic flux lines of the magnetic bodies, such that an attracting force between the slide member and the running surface is created.

5. The lithographic apparatus of claim 4, wherein the bearing system includes a metal back plate, adjoining the magnetic bodies at their side facing away from the surface, said metal back plate being configured to close the magnetic flux lines on said side, the magnetic bodies and the back plate being arranged in a casing of ceramic material.

6. The lithographic apparatus of claim 4, wherein the magnetic bodies are arranged in a metal casing, said metal casing being configured to close the magnetic flux lines on the side of the magnetic bodies facing away from the surface.

7. A lithographic apparatus comprising:
   an illumination system configured to condition a beam of radiation;
   a support structure configured to support a patterning device, the patterning device configured to impart the beam of radiation with a pattern in its cross section;
   a substrate table configured to hold a substrate;
   a projection system configured to project the patterned beam of radiation onto a target portion of the substrate; and
   a slide assembly comprising:
   (a) a base including a running surface,
   (b) a slide member configured to move over the running surface, and
   (c) a bearing system configured to create a distance between the slide member and the running surface, the bearing system comprising:
   (i) a magnetically active system configured to provide a magnetic attraction force in a first direction, said first direction being at least substantially perpendicular to the running surface, and
   (ii) an air bearing system configured to provide a repelling force in a second direction, said second direction being opposite to the first direction, the magnetically active system and the air bearing system being adapted to cooperate in establishing the distance between the slide member and the running surface, wherein the air bearing system includes a plurality of air bearing elements, said plurality of air bearing elements arranged to substantially enclose an area devoid of air bearing elements in which substantially the entire magnetically active system is arranged.

8. The lithographic apparatus of claim 7, wherein the air bearing system encompasses the magnetically active system.

9. The lithographic apparatus of claim 7, further comprising a suction system configured to create at least partial vacuum to create an attraction force.

10. The lithographic apparatus of claim 7, wherein the
   air bearing elements include an array of holes to let out pressurized gas, said air bearing elements being configured to provide a repelling force between the slide member and the surface over which the slide member is configured to move, and
   wherein the magnetically active system includes an array of magnetic bodies,
   wherein the running surface comprises a metal counter plate configured to close the magnetic flux lines of the magnetic bodies, such that an attracting force between the slide member and the running surface is created.

11. The lithographic apparatus of claim 10, wherein the bearing system includes a metal back plate, adjoining the magnetic bodies at their side facing away from the surface, said metal back plate being configured to close the magnetic flux lines on said side, the magnetic bodies and the back plate being arranged in a casing of ceramic material.

12. The lithographic apparatus of claim 10, wherein the magnetic bodies are arranged in a metal casing, said metal casing being configured to close the magnetic flux lines on the side of the magnetic bodies facing away from the surface.

13. A device manufacturing method comprising:
   providing a beam of radiation;
   patterning the beam of radiation with a pattern in its cross-section;
   projecting the patterned beam of radiation onto a target portion of the layer of radiation-sensitive material;
   creating a distance between a running surface of a base and a slide member which carries an object, to allow movement of the slide member over the running surface using a bearing system,
   wherein the bearing system comprises a magnetically active system configured to provide a magnetic attraction force in a first direction, said first direction being substantially perpendicular to the running surface, and an air bearing system configured to provide a repelling force in a second direction, said second direction being opposite to the first direction, the magnetically active system and the air bearing system being adapted to cooperate in establishing the distance between the slide member and the running surface, and
   wherein the air bearing system comprises a plurality of air bearing elements, said air bearing elements arranged to substantially enclose an area devoid of air bearing elements in which substantially the entire magnetically active system is arranged.

14. The method of claim 13,
   wherein said first force and said second force act to space apart the slide member from the running surface and are directed such that a bending moment induced by each of said first and second force on said slide member is substantially zero.

15. The device manufacturing method of claim 14, wherein said slide member is configured to support at least a patterning device or a substrate.

16. The method of claim 13,
   wherein a line of action of said first force substantially coincides with a line of action of said second force such that said first and second force act to space apart the slide member from the running surface.

17. A bearing system configured to support a slide member over a running surface of a base, comprising:
   a magnetically active system configured to provide a magnetic attraction force in a first direction, said first direction being substantially perpendicular to said running surface; and
   an air bearing system configured to provide a repelling force in a second direction, said second direction being opposite to the first direction,
   wherein the air bearing system comprises a plurality of air bearing elements, said air bearing elements arranged to substantially enclose an area devoid of air bearing elements in which substantially the entire magnetically active system is arranged
   such that an action line of the first force substantially coincides with an action line of the second force.

18. The bearing system of claim 17, wherein said plurality of air bearing elements are located at a substantially equal distance from an outside contour of said magnetically active system.

19. The bearing system of claim 17, wherein said magnetically active system includes an array of magnets configured to generate said first force.

20. The bearing system of claim 19, further comprising a metal plate arranged in the slide member and configured to close magnetic lines generated by said array of magnets.

21. The bearing system of claim 17, wherein said air bearing system and magnetically active system are housed in a ceramic casing.

22. The bearing system of claim 17, wherein a bending moment induced by each of said air bearing system and magnetically active system on said slide member is substantially zero.

* * * * *